United States Patent
Yap et al.

(10) Patent No.: US 9,647,187 B1
(45) Date of Patent: May 9, 2017

(54) MULTI-SLICE TWO-DIMENSIONAL PHASED ARRAY ASSEMBLY

(71) Applicant: HRL LABORATORIES LLC, Malibu, CA (US)

(72) Inventors: Daniel Yap, Newbury Park, CA (US); Kevin Geary, Los Angeles, CA (US); James Schaffner, Chatsworth, CA (US)

(73) Assignee: HRL Laboratories, LLC, Malibu, CA (US)

( * ) Notice: Subject to any disclaimer, the term of this patent is extended or adjusted under 35 U.S.C. 154(b) by 234 days.

(21) Appl. No.: 14/290,986

(22) Filed: May 30, 2014

Related U.S. Application Data (60) Provisional application No. 61/829,194, filed on May 30, 2013.

(51) Int. Cl.
| | |
|---|---|
| G02B 6/12 | (2006.01) |
| H01L 21/00 | (2006.01) |
| G01S 13/00 | (2006.01) |
| H01L 33/62 | (2010.01) |
| G01S 7/481 | (2006.01) |
| H01L 21/768 | (2006.01) |
| H01L 33/64 | (2010.01) |
| H01L 23/48 | (2006.01) |
| H01L 23/498 | (2006.01) |
| H01L 23/522 | (2006.01) |
| G01S 13/44 | (2006.01) |

(52) U.S. Cl.
CPC ............ *H01L 33/62* (2013.01); *G01S 7/4815* (2013.01); *G01S 13/4463* (2013.01); *H01L 21/76879* (2013.01); *H01L 23/481* (2013.01); *H01L 23/49827* (2013.01); *H01L 23/5226* (2013.01); *H01L 33/64* (2013.01)

(58) Field of Classification Search
CPC ......... H01L 21/76877; H01L 21/76879; H01L 23/49827; H01L 23/481; H01L 23/5226; G01S 2013/0245; G01S 2013/0254; G01S 13/4463; G01S 7/4815
USPC ................ 385/14; 342/81, 157; 438/109
See application file for complete search history.

(56) References Cited

U.S. PATENT DOCUMENTS

| | | | |
|---|---|---|---|
| 5,138,626 A | 8/1992 | Yap | |
| 5,796,881 A * | 8/1998 | Manasson | H01Q 3/2676 385/14 |

(Continued)

OTHER PUBLICATIONS

U.S. Appl. No. 14/290,983, filed May 30, 2014, Yap et al.

(Continued)

*Primary Examiner* — Robert Tavlykaev
(74) *Attorney, Agent, or Firm* — Ladas & Parry (57) ABSTRACT

A two-dimensional phased array beam former comprising at least first and second chips having each top and bottom surfaces, the bottom surface of the first chip being attached to the top surface of the second chip; the first and second chips having each an emitter side surface, the emitter side surfaces of the first and second chips facing a same direction and comprising each a plurality of emitters; wherein each of said first and second chips comprises at least one conductive post extending between said top and bottom surfaces; the at least one conductive post of the first chip being vertically aligned with and connected to the at least one conductive post of the second chip.

21 Claims, 8 Drawing Sheets

(56) References Cited

U.S. PATENT DOCUMENTS

| | | | |
|---|---|---|---|
| 5,943,159 A * | 8/1999 | Zhu | G02F 1/292 359/254 |
| 6,195,373 B1 | 2/2001 | Fukunaga | |
| 6,393,185 B1 | 5/2002 | Deacon | |
| 6,400,008 B1 * | 6/2002 | Farnworth | H01L 23/481 257/621 |
| 8,344,503 B2 | 1/2013 | Sanders et al. | |
| 8,451,872 B2 | 5/2013 | Arimoto et al. | |
| 8,803,308 B2 * | 8/2014 | Ishikawa | H01L 22/34 257/48 |
| 8,810,448 B1 * | 8/2014 | Ellsworth | H05K 7/20636 211/41.17 |
| 2006/0128060 A1 * | 6/2006 | Kurita | H01L 25/0657 438/109 |
| 2009/0103875 A1 | 4/2009 | Shimizu et al. | |
| 2009/0302435 A1 * | 12/2009 | Pagaila | H01L 21/561 257/659 |
| 2010/0127345 A1 * | 5/2010 | Sanders | H01L 21/6835 257/528 |
| 2011/0049676 A1 * | 3/2011 | Ding | H01L 23/481 257/536 |
| 2011/0147946 A1 * | 6/2011 | Lee | H01L 21/76898 257/774 |
| 2011/0291268 A1 * | 12/2011 | Wang | H01L 23/481 257/737 |
| 2012/0201499 A1 * | 8/2012 | Buijs | G02B 6/00 385/78 |
| 2012/0257860 A1 * | 10/2012 | Li | G02B 6/3858 385/83 |
| 2013/0088381 A1 * | 4/2013 | Puzella | G01S 7/032 342/154 |
| 2013/0143367 A1 * | 6/2013 | Sanders | H01L 21/6835 438/125 |
| 2014/0159120 A1 * | 6/2014 | Ahmed | H01L 21/2254 257/213 |
| 2014/0198013 A1 * | 7/2014 | Saraswat | H01L 21/486 343/893 |
| 2014/0357074 A1 * | 12/2014 | Kim | H01L 24/05 438/613 |

OTHER PUBLICATIONS

U.S. Appl. No. 14/290,979, filed May 29, 2014, Yap et al.
U.S. Appl. No. 61/829,194, filed May 30, 2013, Yap et al.
A. Hosseini, D. Kwong, Y. Zhao, Y.-S. Chen, F. Crnogorac, R.F.W. Pease, and R T. Chen, "Unequally spaced waveguide arrays for silicon nanomembrane-based efficient large angle optical beam steering," IEEE J. Selected Topics in Quantum Electronics, vol. 15, No. 5, pp. 1439-1446, 2009.
A. W. Topol, et al., "Enabling technologies for wafer-level bonding of 3D MEMS and integrated circuit structures," Proceedings 54th Electronic Components and Technology Conference, pp. 931-398, 2004.
B. D. Steinberg, Principles of Aperture and Array System Design, Wiley-Interscience, New York, 1976.
C. A. Balanis, Antenna Theory: Analysis and Design, 2nd edition, Wiley, New York, Sections 3.6, 6.10, 12.2, and 12.3, 1997.
D. Kwong, A. Hosseini, Y. Zhang, and R.T. Chen, "1 × 12 Unequally spaced waveguide array for actively tuned optical phased array on a silicon nanomembrane," Applied Physics Letters, vol. 99, 051104, 2011.
D. Kwong, Y. Zhang, A. Hosseini and RT. Chen, "Integrated optical phased array based large angle beam steering system fabricated on silicon-on-insulator," Proceedings SPIE vol. 7943, p. 79430Y, 2011.
F. Vasey, F. K. Reinhart, R Houdre, and J. M. Stauffer, "Spatial optical beam steering with an AlCaAs integrated phased array," Appl. Opt. 32, pp. 3220-3232, 1993.
J. A. Burns, et al., "A wafer-scale 3-D circuit integration technology," IEEE Trans. Electron Devices, vol. 53, pp. 2507-2516, 2006.
J. A. McCaulley, V. M. Donnelly, M. Vernon and I. Taha, "Temperature dependence of the near-infrared refractive index of silicon, gallium arsenide, and indium phosphide," Physical Review B, vol. 49, pp. 7408-7417,1994.
J. E. Peters, P. D. Ownby, C. R Poznich, J. C. Richter and D. W. Thomas, "Infrared absorption of Czochralski germanium and silicon," Proceedings SPIE vol. 4452, pp. 17-24,2001.
J. H. Abeles and R J. Deri, "Suppression of sidelobes in the far-field radiation patterns of optical waveguide arrays," Applied Physics Letters, vol. 53, pp. 1375-1377, 1988.
J. J. McMahon, E. Chan, S. H. Lee, R. J. Gutmann and J.-Q. Lu, "Bonding interfaces in wafer-level metal/adhesive bonded 3D integration," Proc. 2008 Electronic Components and Technology Conference, pp. 871-878, 2008.
L. Schulwitz and A. Mortazawi, "A Tray Based Rotman Lens Array with Beamforming in Two Dimensions for Millimter-Wave Radar," IEEE Intl. Symposium on Phased Array Systems and Technology (ARRAY), pp. 850-853, Oct. 2010.
M. Jarrahi, R F. W. Pease, D. A. B. Miller and T. H. Lee, "High-speed optical beam-steering based on phased-array waveguides," J. Vacuum Science and Technology B, vol. 26, p. 2124-2126, 2008.
P. Enquist, "Scalable direct bond technology and applications driving adoption," 2011 IEEE Intl. 3D System Integration Conference (3DIC), p. P-1-6, 2012.
P. Enquist, et al., "Low cost of ownership scalable copper direct bond interconnect 3D IC technology for three dimensional integrated circuit applications," 2009 IEEE Intl. Conf. on 3D System Integration, 2009.
P.F. McManamon, T.A. Dorschner, D.C. Corkum, L.J. Friedman, D.S. Hobbs, M.K.O. Holz, S. Liberman, H. Nguyen, D.P. Resler, RC. Sharp, and E.A. Watson, "Optical phased array technology," Proceedings of IEEE, vol. 84, No. 2, pp. 268-298, 1996.
R J. Mailloux, Phased Array Antenna Handbook. Artech House, Boston, 1994, pp. 468-471.
T.E. Dillon, C.A. Schuetz, Rd. Martin, D.C. Mackrides, P.F. Curt, J. Bonnet, and D.W. Prather, "Nonmechanical Beam Steering Using Optical Phased Arrays," Proc. of SPIE, vol. 8184, 81840F, pp. 1-11, 2011.
W. Peng, et al., "Single-crystal silicon/silicon dioxide multilayer heterostructures based on nanomembrane transfer", Applied Physics Letters, vol. 90, pp. 183107-1-183107-3.
From U.S. Appl. No. 14/290,983, Application and Office Actions.
From U.S. Appl. No. 14/290,979, Application and Office Actions.
From U.S. Appl. No. 61/829,194, Application.
From U.S. Appl. No. 14/290,983 (Unpublished, Non-Publication Requested), Restriction/Election mailed on Jan. 6, 2016.
From U.S. Appl. No. 14/290,979 (Unpublished, Non-Publication Requested), Non-Final Rejection mailed on Feb. 17, 2016.
From U.S. Appl. No. 14/290,979 (Unpublished, Non Publication Requested), Restriction/Election mailed on Sep. 16, 2015.
U.S. Appl. No. 14/290,983 (unpublished, non-publication requested), Non-Final Rejection mailed on Mar. 31, 2016.
"Wafer-to-wafer Alignment for Three-Dimensional Integration: A Review", by Sang Hwui Lee et Al. Journal of Microelectromechanical Systems, vol. 20, No. 4, Aug. 2011, pp. 885-898.

* cited by examiner

MULTI-SLICE TWO-DIMENSIONAL PHASED ARRAY ASSEMBLY

CROSS REFERENCE TO RELATED APPLICATIONS

The present disclosure claims priority of U.S. provisional application No. 61/829,194, filed on May 30, 2013 and entitled "MULTI-WAVELENGTH OPTICAL BEAM FORMER", which is hereby incorporated by reference.

REFERENCE TO A CONTRACT

This disclosure relates to work performed under Government contract No. N00014-13-C-0036; entitled "MULTI-BAND OPTICAL PHASED ARRAY BEAM FORMER".

INCORPORATION BY REFERENCE

The present disclosure relates to co-pending US patent Ser. No. 14/290,983, filed on May 29, 2014 and entitled: "A PSEUDO-RANDOMLY SPACED TWO-DIMENSIONAL PHASED ARRAY ASSEMBLY", which is hereby incorporated by reference.

The present disclosure relates to co-pending U.S. patent Ser. No. 14/290,979, filed on May 29, 2014 and entitled: "MULTI-WAVELENGTH BAND OPTICAL PHASE AND AMPLITUDE CONTROLLER", which is hereby incorporated by reference.

TECHNICAL FIELD

The present disclosure relates to a two-dimensional optical phased array assembly comprised of a plurality of stacked chips comprising each a mono-dimensional optical phased array.

BACKGROUND

A two-dimensional optical phased array, or beam former, can for example be used in an infra-red counter measures (IRCM) system, for directing a high-power beam of potentially multi-band light at the optical aperture of a threat to dazzle and jam its optical seekers. These phased arrays can therefore improve the survivability of military and commercial platforms under attack from threat munitions and missiles that may be guided by a variety of electro-optic (EO) and infrared (IR) seeker types, such as semi-active laser (SAL) designator sensors and EO/IR imagers that sense one or multiple wavelength bands, with these seekers often sharing the same optical aperture. For at least these reasons, two-dimensional optical phased arrays are of interest to providers of military and commercial aircraft, as well as to any commercial developer of IRCM systems for military and civilian applications.

A two-dimensional optical phased array can also be used in compact laser radar systems. Such systems are used as altimeters for aircraft (including rotorcraft). Such systems also are envisioned for some automobiles. An advantage of a phased array is its large field of regard and fast beam steering, which means that one phased array could take the place of 4 to 10 or more small mechanical or micro-electro-mechanical (MEM) beam steerers.

Figure 1:
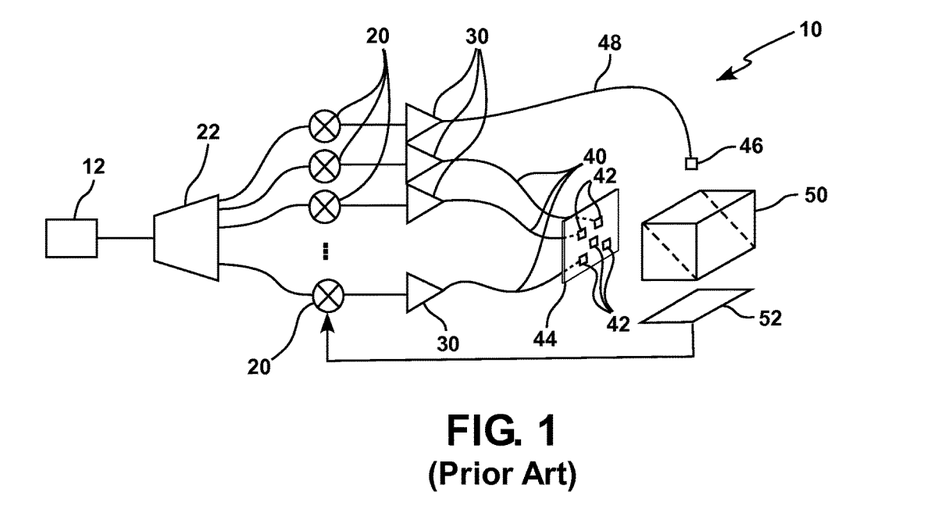
FIG. 1 illustrates a known optical phased array using optical-waveguide devices.

FIG. 1 illustrates a known optical phased array 10 using optical-waveguide devices to accomplish phase shifting and amplitude adjustment of light from a light source 12, such as disclosed in: "T. E. Dilon, C. A. Schuetz, R. D. Martin, D. G. Mackrides, P. F. Curt, J. Bonnet, and D. W. Prather, "Non-mechanical Beam Steering Using Optical Phased Arrays," Proc. of SPIE, Vol. 8184, 81840F, pp. 1-11, 2011".

A linear array of optical-waveguide phase shifters 20 placed side by side provides phase shifts of light from light source 12, after it is split by an optical splitter 22. Optical waveguide phase shifters achieve a 0 to $2a$ range of phase shift in one phase shifter by controlling a voltage or current applied to the electrodes of the phase shifter.

A series of high output power optical amplifiers 30 is provided to adjust the amplitude of the output of each phase shifter 20. Flexible optical fibers 40 connect each output of amplifiers 30 to an optical emitter output aperture 42 of an emitter surface 44 that comprises a desired two dimensional pattern of emitter output apertures.

Figure 2:
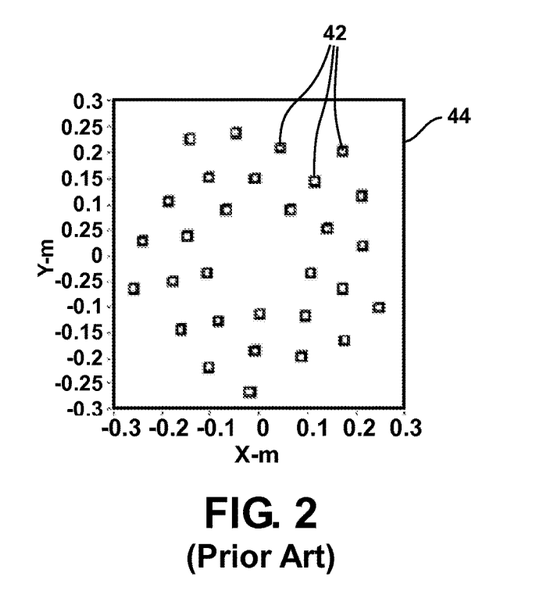
FIG. 2 illustrates a front view of an emitter surface of the phased array of FIG. 1.

FIG. 2 illustrates a front view of an emitter surface 44 having a desired two dimensional pattern of emitter output apertures 42 as illustrated in FIG. 1. Emitter output aperture 42 are arranged along a non-uniform spacing on surface 34 to eliminate the dominant grating lobes and reduce the larger side lobes of the phased array.

An important limitation of using optical fibers is that the minimum spacing between adjacent emitter is then very large and thus the average side lobe power is fairly high. Also, since the size of the optical mode in a fiber is large compared to the wavelength of the light, the field of regard is very small (approximately 1 degree). For at least the above reasons, achieving a two-dimensional optical phased array using one or more mono-dimensional arrays of phase shifters and capable of steering an output optical beam over a large field of regard (e.g.,)±45-60° along two orthogonal axes has been difficult.

Another deficiency of known phased arrays such as phased array 10 is that the phase of the light output from the fibers 40, 48 can fluctuate as a result of mechanical vibrations or changes in ambient temperature, thus detrimentally affecting the operation of optical phased array 10.

Figure 3A:
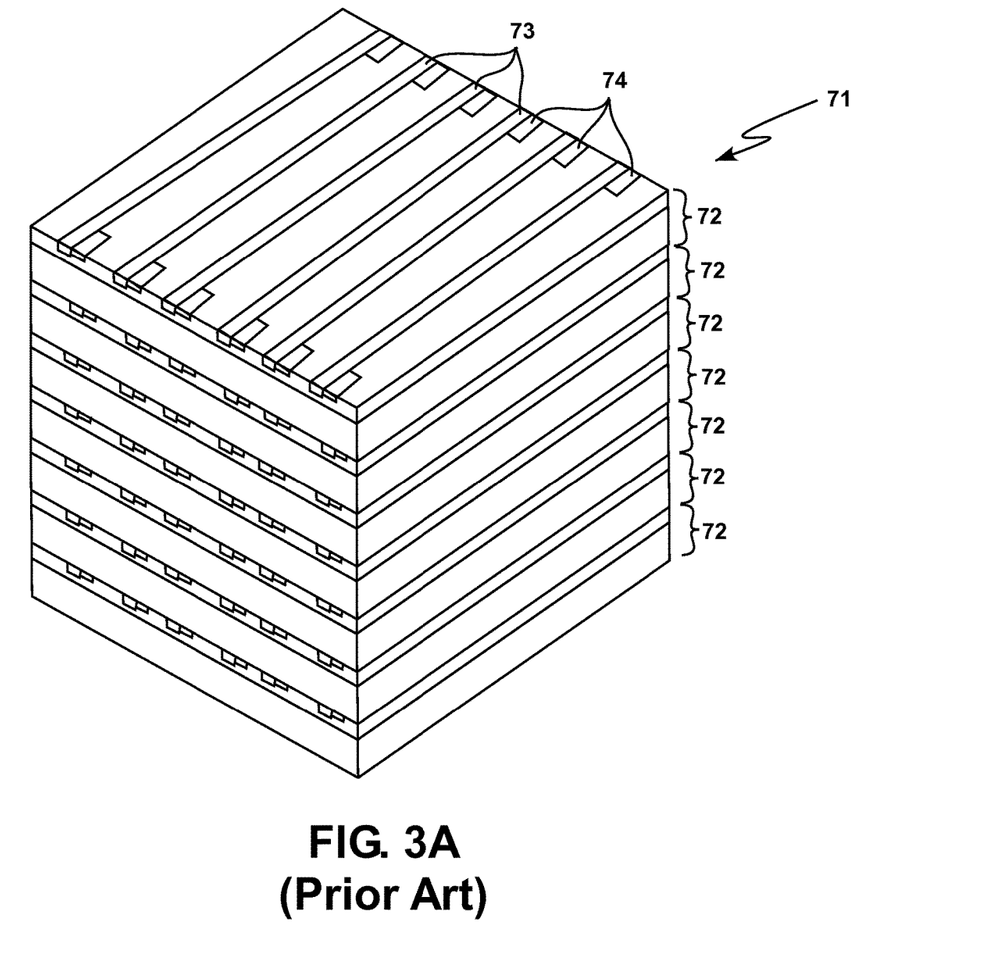
FIG. 3A illustrates a known two-dimensional optical phased array assembly having a plurality of silicon nanomembranes each containing optical phased array elements.

A two-dimensional optical phased array 71 that consists of a stack of one-dimensional optical phased array slices 72 is illustrated in FIG. 3A. Such two-dimensional optical phased array is described in an article by A. Hosseini, D. Kwong, Y. Zhao, Y.-S. Chen, F. Crnogorac, R. F. W. Pease, and R. T. Chen, "Unequally spaced waveguide arrays for silicon nanomembrane-based efficient large angle optical beam steering," IEEE J. Selected Topics in Quantum Electronics, Vol. 15, No. 5, pp. 1439-1446, 2009. Each slice 72 of the array consists of a silicon nanomembrane, with a suggested approach for constructing an assembly of multiple slices being a nanomembrane transfer technique described in an article by W. Peng, et al., "Single-crystal silicon/silicon dioxide multilayer heterostructures based on nanomembrane transfer", Applied Physics Letters, Vol. 90, pp. 183107-1-183107-3, 2007. As described in the article by Peng, et al., a silicon nanomembrane is formed by etching the silicon dioxide layer of a silicon-on-insulator chip in an acid solution, to separate the thin silicon membrane layer from its initial silicon substrate. The membrane rises to the surface of the solution, at which point it can be transferred to deionized water for rinsing and then be lifted out of the water bath with a desired final substrate. After the remaining water evaporates, the membrane adheres to the final substrate to which it has been transferred. This process can be repeated to form a stack of multiple nanomembrane layers. Spin-on-glass can be deposited onto each of the transferred nanomembrane layers to separate that layer from a subsequent nanomembrane layer. Each silicon nanomembrane layer can be quite thin, with a thickness of approximately 100 nm reported in the paper. Optical phased array elements 73 can be formed on the nanomembrane layer, with control contacts 74 arranges on the edge of the nanomembrane layer.

Figure 3B:
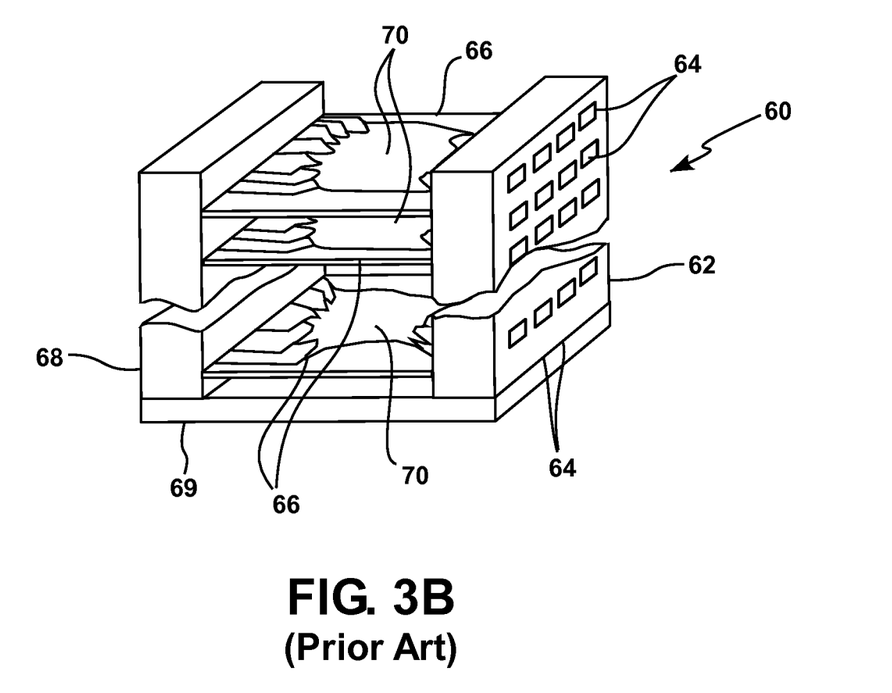
FIG. 3B illustrates a known two-dimensional RF phased array assembly having a plurality of mono-dimensional RF emitter boards.

FIG. 3B illustrates a known two-dimensional RF phased array assembly 60 having a two-dimensional array 62 of RF emitters 64. This assembly 60 is described in an article by L. Schulwitz and A. Mortazawi, "A Tray Based Rotman Lens Array with Beamforming in Two Dimensions for Millimter-Wave Radar," IEEE Intl. Symposium on Phased Array Systems and Technology (ARRAY), pp. 850-853, October 2010". Assembly 60 comprises a plurality of mono-dimensional phased array boards 66 that are placed on top of each other. The RF phase array assembly depicted in FIG. 3B illustrates two important features of a two-dimensional phased array assembly. The features are, first, a means to provide a mechanical support structure that defines and establishes the relative locations of the emitters of the phased array, and especially the placement of the boards of the array. A second feature is a means to provide for and connect electrical control signals to the boards of the assembly that determine the relative phase and amplitude of the radiation emitted by their emitters. In assembly 60, the boards 66 are secured at one end to a first mechanical structure supporting array 62 and at an opposite end to a second mechanical structure 68. Array 62 and structure 68 are secured to a base 69. Each board 66 comprises a Rotman lens 70 with a mono-dimensional array of outputs (not shown) connected each to an emitter horn antenna 64 of array 62. The electrical connections to each of the boards 66 are made by means of wires (not shown) that are connected to the side edges of boards 66. It is noted that the prior optical phased array assembly of the article by Hosseini et al. cited above can likewise have its electrical connections made to the side edges of its silicon nanomembranes. However, the feature of having a set of wires connected to the side of each board of a two-dimensional assembly, which proved suitable for a RF array that requires only a small number of elements in each boards and only a few boards, is difficult to implement in an optical phased array. For example, to achieve a narrow output optical beam and also high beam efficiency (high ratio of the power in the main beam compared to the total emitted power), an optical array must have many elements in each board, or slice, and many slices. Constructing an assembly having the necessary number of wires and connecting said wires to an electronic phase-control processor proved difficult.

Although the article by Hosseini, et al. does not discuss ways to provide the electrical interconnections to the layers or slices of the two-dimensional array, it does mention that the challenges for achieving the multi-level, stacked phased array structure are similar to the problems presently faced by those developing three-dimensional electronic integrated circuitry.

One prominent way to achieve a three-dimensional electronic integrated circuit is described for example in an article by A. W. Topol, et al., "Enabling technologies for wafer-level bonding of 3D MEMS and integrated circuit structures," Proceedings 54th Electronic Components and Technology Conference, pp. 931-398, 2004. In such an approach, a three-dimensional circuit comprises multiple layers or chips of conventional planar electronic integrated circuits that are formed in the device layers of a silicon base substrate. The chips that contain the electronic devices and the integrated circuits are then bonded on top of each other, by removing the initial base substrates of silicon on which those integrated circuits were fabricated and using glass temporary-carrier (or handle) wafers to transport the chips for bonding to the stack. After one face of a chip is attached to the stack, the handle wafer of the chip is detached from the other face of that chip. A direct wafer-to-wafer bond by means of intermolecular Van der Waals attractive forces between oxides followed by annealing can be used to attach the chips to each other. After two chips are attached, vertical interconnects can be formed between those chips. The process steps for making the vertical electrical connections between bonded chips by etching deep via holes that are subsequently filled with metal is for example described in an article by J. A. Burns, et al., "A wafer-scale 3-D circuit integration technology," IEEE Trans. Electron Devices, Vol. 53, pp. 2507-2516, 2006.

Instead of forming the electrical interconnections between the multiple chips after those chips are attached to each other, it also is possible to form those electrical interconnections as part of the attachment and bonding process for successive chips, as described for example in an article by J. J. McMahon, E. Chan, S. H. Lee, R. J. Gutmann and J.-Q. Lu, "Bonding interfaces in wafer-level metal/adhesive bonded 3D integration," Proc. 2008 Electronic Components and Technology Conference, pp. 871-878, 2008. The structures described in this article require that metal pads be formed on both the top and bottom faces of each chip to facilitate the electrical connections made between adjacent chips. A combination of benzocyclobutene (BCB) and copper (Cu) bonds is used to attach a chip to an adjacent chip of this assembly. BCB is a fairly flexible and conformal adhesive and thus can accommodate moderate-height steps in the overall profile of a chip. However, the quality of the metal bond can be compromised by using BCB that has been only soft-baked prior to bonding. A less conformal partially cured BCB is preferred. It also is possible to use a combination of an oxide region and a metal region on each face of the chips to be bonded, as taught for example in articles by P. Enquist, et al., "Low cost of ownership scalable copper direct bond interconnect 3D IC technology for three dimensional integrated circuit applications," 2009 IEEE Intl. Conf. on 3D System Integration, 2009 and by P. Enquist, "Scalable direct bond technology and applications driving adoption," 2011 IEEE Intl. 3D System Integration Conference (3DIC), p. P-1-6, 2012. Besides using copper, other metal-to-metal bonds such as nickel-to-nickel or gold-to-gold also have been done in combination with oxide-to-oxide bonds. In general, the quality of the bond can be improved by heating the bonded pieces to a somewhat higher temperature, such as 350° C. One problem arising with such higher temperature bonding is that the compression steps of the bonding are likely to distort the thickness of the chips manufactured as suggested in the above-cited references.

In the structures described by the above-cited McMahon and Endquist references, the electrical interconnections from one chip to the next and through multiple chips follow a winding path. It is noted that there is no straight metal path that extends from the base of the assembly and through the multiple chips. It is also noted that these 3D electronic integrated circuits do not contain any mechanical framework or structure that defines the physical spacing between its layers.

For an optical assembly that comprises a two-dimensional emitter array of a phased array formed out of a chip/slices stack, it is often desirable for the relative locations of the chips in the stack to be controlled to a precision of approximately $\lambda/10$ or better, where $\lambda$ is the wavelength of the light in the beam formed and steered by the phased array. This means, for example, that if λ=1.5 µm, the relative spacing of the chips should be controlled to an accuracy of 0.15 µm or better.

The inventors have noted that the compression steps of higher temperature bonding as disclosed above are likely to distort the thickness of chips manufactured as suggested in the above-cited references when assembling chip stack to manufacture a two-dimensional emitter array, thereby possibly affecting the performances of said emitter array in a detrimental manner.

Further to the above considerations, the inventors have also noted that, for an optical assembly, there is a need for the assembly to be sufficiently rigid that mechanical vibrations and moderate changes in temperature will not significantly change the spacing between the array emitter elements. Chips produced and assembled as suggested in the above-cited references on electronic 3D integrated circuits do not provide this desired mechanical rigidness.

There exists a need for a two-dimensional optical phased array comprised of elements such that the assembly of the elements does not detrimentally affect the operation of the optical phased array. There also exists a need for a method for manufacturing such a two-dimensional optical phased array.

SUMMARY OF THE INVENTION

The present disclosure relates to a two-dimensional optical phased-array or beam former that is constructed as a stacked assembly of multiple chips containing optical phased-array elements comprising optical waveguide structures, metal electrodes and interconnects and dielectric filling material. The stack can be electrically and mechanically coupled to an electronic integrated circuit that provides the control signals for controlling the phase and amplitude of the light emitted from (or received by) the phased-array elements of the chips. The optical phased array is a reversible structure that can have an output optical beam emitted from its emitter apertures pointed at a particular far-field direction. The array also can collect light, via its emitter apertures, from a particular far-field direction. According to the present disclosure, each chip of the two-dimensional phased array contains conductive posts, for example metal posts, which extend completely through the chip, from top to bottom. As the multiple chips are assembled together as slices of the assembly, these through-posts are aligned concentrically and stacked directly above each other to provide a mechanical frame for the assembly. These conductive posts also provide mechanical control of the vertical spacing between the phased-array elements of the chips of the phased-array. Some of these same posts can also provide electrical interconnection from a phased-array element through the assembly and to a base of the assembly, which could be an electronic integrated circuit that provides the control signals for the phased array. For some embodiments of the beam former, the spacing between the chips is non-uniform. In that case, the posts of different chips have different heights.

The present disclosure also describes a method for fabricating a stacked assembly of multiple slices that contain each a mono-dimensional optical phased array chip. The posts are preferably formed during the fabrication of the phased-array elements in a chip; for example by some means such as electroplating that provide accurate control of the height of those posts. The chips reside on an initial substrate during the fabrication of their phased-array elements. The phased-array elements and posts for multiple chips of the beam former assembly can be fabricated on a same substrate, using the same fabrication process steps. A variation in the desired heights of the posts can then be accommodated by additional electroplating or metal deposition or etching steps that adjust the post heights as needed for some regions of array elements on the substrate wafer and not for other regions. Additional fabrication steps can include etching layers of semiconductor material grown on the substrate into optical waveguide structures, forming dielectric regions, forming metal electrodes, forming metal interconnection paths between the electrodes and the posts, and forming metal walls. Other fabrication steps can include depositing one or more dielectric adhesive layers on a chip, bonding one chip onto another chip and then removing the initial substrate from the newly bonded chip. Other fabrication steps can include forming solder bumps on the stacked assembly and/or on the electronic integrated circuit base; bonding the stacked assembly to the electronic integrated circuit base by means of the solder bumps and back-filling the spaces between the solder bumps with a supporting material. Yet other fabrication steps can involve aligning and bonding other pieces, such a lens arrays, onto side or end faces of the multi-chip assembly.

An embodiment of the present disclosure relates to a two-dimensional phased array beam former comprising at least first and second chips having each top and bottom surfaces, the bottom surface of the first chip being attached to the top surface of the second chip; the first and second chips having each an emitter side surface, the emitter side surfaces of the first and second chips facing a same direction and comprising each a plurality of emitters; wherein each of said first and second chips comprises at least one conductive post extending between said top and bottom surfaces; the at least one conductive post of the first chip being vertically aligned with and connected to the at least one conductive post of the second chip.

According to an embodiment of the present disclosure, the plurality of emitters of each chip is a plurality of optical emitters, and the two-dimensional phased array beam former is a two-dimensional optical phased array.

According to an embodiment of the present disclosure, the first and second chips comprise each a plurality of optical phase shifters, each optical phase shifter being coupled to an optical emitter.

According to an embodiment of the present disclosure, the first and second chips comprise each a plurality of optical amplitude adjusters, each optical amplitude adjuster being coupled to an optical phase shifter.

According to an embodiment of the present disclosure, at least one of the first and second chips comprises at least one heat conducting wall between at least two optical amplitude adjusters of said plurality of optical amplitude adjusters.

According to an embodiment of the present disclosure, said at least one heat conducting wall is connected to a further conductive post extending between the top and bottom surfaces of said at least one of the first and second chips.

According to an embodiment of the present disclosure, said two-dimensional optical phased array comprises a third chip attached to one of the top surface of the first chip and the bottom surface of the second chip; the third chip comprising an integrated electronic circuit that is electrically connected to the at least one conductive post of said one of the first chip and the second chip to which the third chip is attached to.

According to an embodiment of the present disclosure, said integrated electronic circuit is arranged to provide at least a control signal for controlling the phase and/or amplitude of the light emitted from at least one optical emitter.

According to an embodiment of the present disclosure, said one of the first chip and the second chip attached to the third chip comprises a heater.

According to an embodiment of the present disclosure, said one of the first chip and the second chip attached to the third chip comprises a second conductive post extending between its top and bottom surfaces, said second conductive post being connected electrically to said heater and to said integrated electronic circuit.

According to an embodiment of the present disclosure, the conductive posts of the first and second chips have different heights.

According to an embodiment of the present disclosure, the bottom surface of the first chip is attached to the top surface of the second chip by at least an attachment of the conductive post of the first chip to the conductive post of the second chip.

According to an embodiment of the present disclosure, the first and second chips comprise each a plurality of conducting posts extending between the top and bottom surfaces of the chips; the plurality of conducting posts of the first chip being vertically aligned with the plurality of conducting posts of the second chip; wherein the bottom surface of the first chip is attached to the top surface of the second chip by at least a conductive attachment of said plurality of conductive posts of the first chip to said plurality of conductive posts of the second chip.

Another embodiment of the present disclosure relates to a method of fabricating a two-dimensional phased array beam former, the method comprising: fabricating at least first and second chips having each top and bottom surfaces, wherein: each of said first and second chips comprises at least one conductive post extending between said top and bottom surfaces at a same position in said first and second chips; and wherein the first and second chips each have an emitter side surface comprising a plurality of emitters; the method further comprising attaching the bottom surface of the first chip to the top surface of the second chip; such that the emitter side surfaces of the first and second chips face a same direction; said attaching the bottom surface of the first chip to the top surface of the second chip comprising attaching the conductive post of the first chip to the conductive post of the second chip.

According to an embodiment of the present disclosure, the plurality of emitters of each chip is a plurality of optical emitters, and the two-dimensional phased array beam former is a two-dimensional optical phased array.

According to an embodiment of the present disclosure, said fabricating at least first and second chips comprises fabricating first and second chips having each a plurality of optical phase shifters, each optical phase shifter being coupled to an optical emitter.

According to an embodiment of the present disclosure, said fabricating at least first and second chips comprises fabricating first and second chips having each a plurality of optical amplitude adjusters, each optical amplitude adjuster being coupled to an optical phase shifter.

According to an embodiment of the present disclosure, said fabricating at least first and second chips comprises fabricating at least one heat conductive wall between at least two optical amplitude adjusters of at least one of the first and second chips.

According to an embodiment of the present disclosure, said fabricating at least first and second chips comprises: fabricating said first and second chips on a common substrate; and separating said first and second chips.

According to an embodiment of the present disclosure, said separating said first and second chips comprises separating the first chip on a first portion of said common substrate from the second chip on a second portion of said common substrate.

According to an embodiment of the present disclosure, said fabricating at least first and second chips comprises fabricating said conductive post using an electroplating process.

According to an embodiment of the present disclosure, said fabricating at least first and second chips comprises fabricating conductive posts having different heights.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 4:
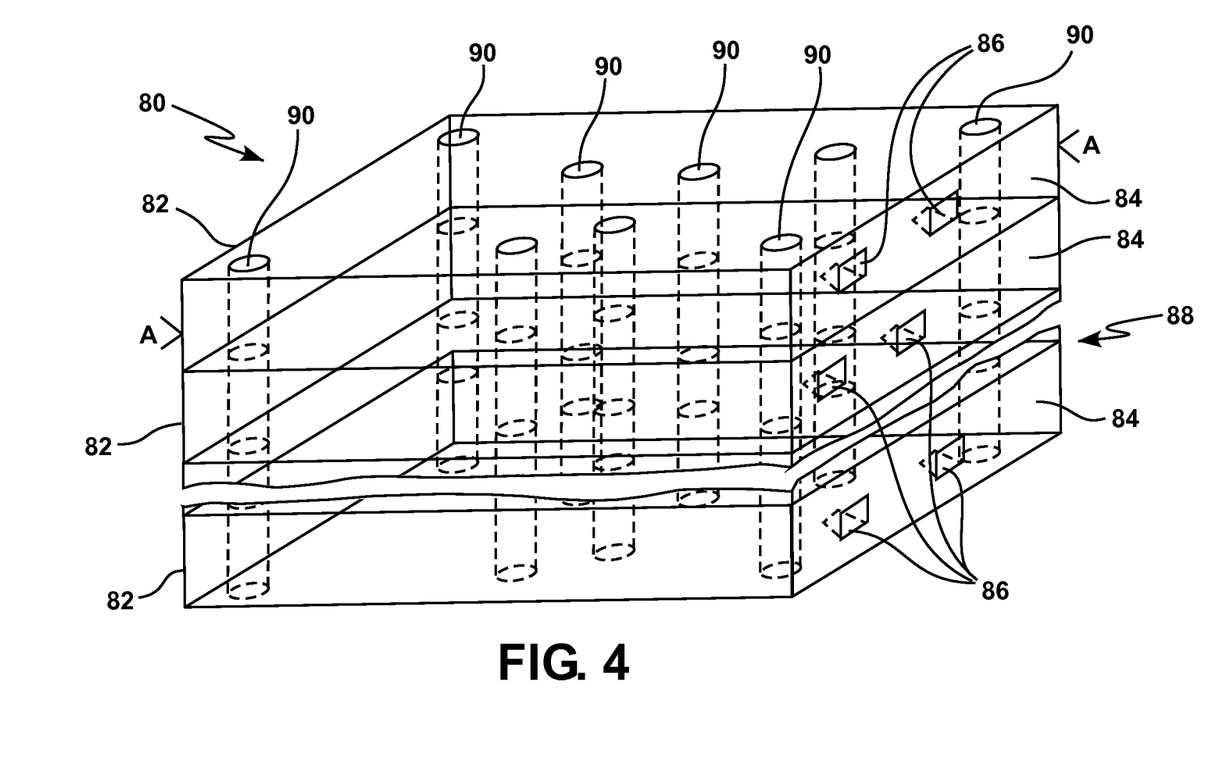
FIG. 4 illustrates an elevation view of a two-dimensional optical phased array according to an embodiment of the present disclosure.

FIG. 4 shows an elevation view of a two-dimensional optical phased array 80 according to an embodiment of the present disclosure. Phased array 80 comprises a plurality of chips 82 attached together as multiple slices in a stack. Each chip 82 has top and bottom surfaces as well as an emitter side surface 84 comprising a plurality of optical emitters or emitter apertures 86. The emitter side surfaces 84 of the attached chips 82 face a same direction; the stacked chips thus forming an emitter array 88. The side of the chips opposite their emitter side is preferably an input side that comprises optical inputs; the stacked chips thus forming an input array (not shown). According to an embodiment of the present disclosure, an array of convergent microlenses can be arranged on the side of the stack comprising the input array, thus enabling the input array to receive light directly from a single light source.

According to an embodiment of the present disclosure, an array of divergent microlenses can be arranged on the side of the stack comprising the emitter array, thus increasing the field of regard of the emitter array.

According to an embodiment of the present disclosure, the chips 82 comprise each at least one conductive post 90, for example metallic, extending between the top and bottom surfaces of the chip along a direction perpendicular to the top and bottom surfaces of the chip 82. The conductive posts 90 of the stacked chips 82 are vertically aligned and they are connected together.

As detailed hereafter, posts 90 provide mechanical control of the vertical spacing between adjacent chips 82 of the stack 80 by allowing the physical spacing between array elements, such as the optical emitters of adjacent chips, to be achieved with a desired accuracy. According to an embodiment of the present disclosure, the desired accuracy can be of less than 1 µm.

Further, posts 90 help providing a rigid mechanical frame for the multi-chip stack 80, such that the spacing between the phased-array elements remains relatively unchanged despite vibrations and/or despite ambient temperature and pressure changes applied to the stack 80.

According to an embodiment of the present disclosure, posts 90 can provide electrical interconnection paths between electrodes of phased array elements in the chips and an electronic integrated circuit or an electronic circuit that supplies the control signals for those electrodes. According to an embodiment of the present disclosure, such an electronic integrated circuit or electronic circuit can be comprised in, or supported by, a controller chip 170 and/or a chip alignment base 78 attached permanently to the top or bottom chips of the stack 80. Passing electrical interconnections between the phased array elements and a separate electronic controller through the body of the stack 80 rather than in the form of wires or cables located outside of the stack allows a unit comprising the phased array & controller to be more compact and more mechanically and environmentally robust.

According to an embodiment of the present disclosure, posts 90 can provide thermally conductive paths for removing heat generated by phased array elements in a chip 82 and conducting that heat to heat-sinks that may be located above or beneath the stack. Such thermally conductive paths can for example provide thermal shielding to establish regions having a reference temperature for thermo-optic controlled array elements, and/or provide thermal isolation between adjacent array elements.

Figure 5:
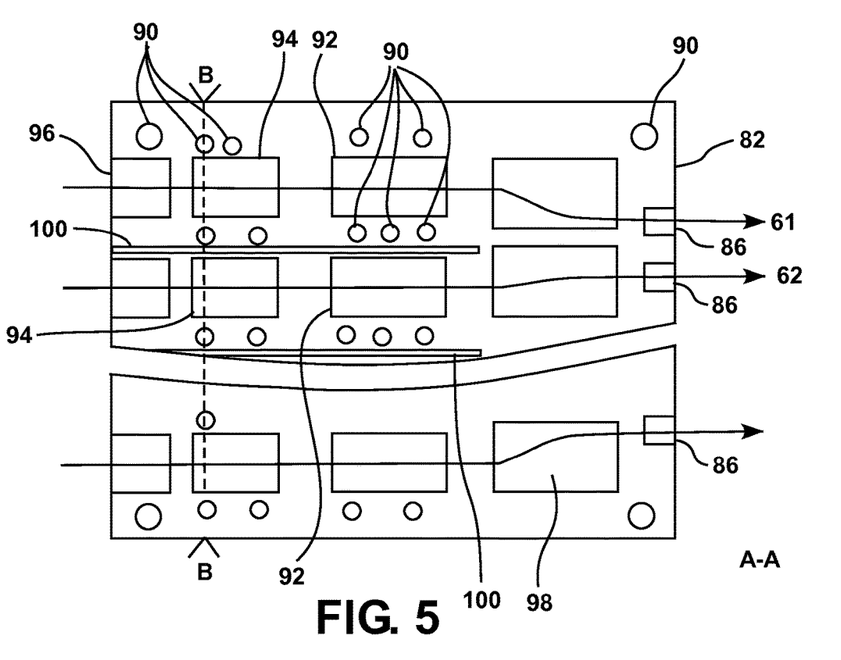
FIG. 5 illustrates a cross section in the plane A-A of a chip of the optical phased array of FIG. 4.

FIG. 5 shows a cross section in the plane A-A of a chip 82 of the optical phased array of FIG. 4. Plane A-A is parallel to the top and bottom surfaces of chip 82. According to an embodiment of the present disclosure, chip 82 comprises a mono-dimensional array of optical emitter apertures 86. Each optical emitter aperture 86 is coupled to an optical amplitude adjuster 92, itself coupled through an optical phase shifter 94 to an optical input 96. Optical emitter aperture 86 is coupled to optical amplitude adjuster 92 through an S shaped waveguide 98 allowing to position emitter apertures 86 at non-uniform pseudo-random distances from each other. Optionally, chip 82 can comprise heat conducting walls 100 between adjacent optical amplitude adjusters 92 or adjacent optical phase shifters 94. Optionally, chip 82 can comprise top and bottom conducting walls (not shown) above and below optical amplitude adjusters 92 or adjacent optical phase shifters 94. FIG. 5 illustrates the path of three light beams L1, L2, Ln, entering through respective optical inputs 96, traversing optical phase shifters 94, optical amplitude adjusters 92 and S shaped waveguides 98, and emerging from emitter apertures 86. According to an embodiment of the present disclosure, optical amplitude adjusters can be two-mode-coupler power splitters.

Figure 6:
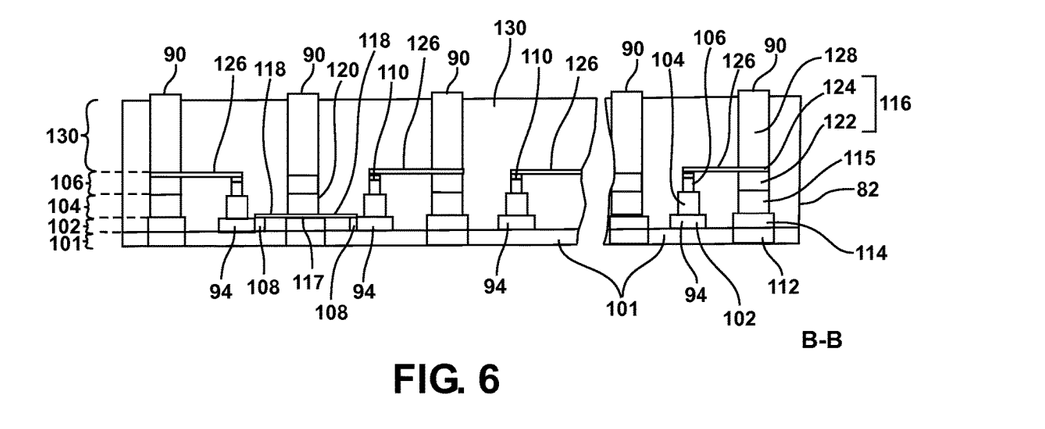
FIG. 6 illustrates a cross section in the plane B-B of the chip of FIG. 5.

FIG. 6 shows a cross section in the plane B-B of chip 82. Plane B-B is parallel to the emitter side of chip 82. According to an embodiment of the present disclosure, the optical components 92, 94, 96, 98 of chip 82 are fabricated by the growth, on a growth substrate (not shown on FIG. 6) of a plurality of epitaxial layers. Advantageously, the epitaxial layers can be grown on an etch stop layer 101, for example of GaInAs, for easing removal of the growth substrate, for example of InP, in a later step of the fabrication process of Chip 82.

If for example the phased array operates at eye-safe wavelengths (e.g., >1.4 µm), candidate materials for the substrate wafer include semiconductors such as InP, GaAs, CdTe. GaSb and InAs. FIG. 6 shows a cross section of phase shifters 94 comprising an InP substrate layer 102. According to an embodiment of the present disclosure, phase shifters 94 comprise on top of substrate layer 102 a number of upper layers of materials having appropriate optical refractive indexes and electronic band gaps, and being lattice matched (or approximately lattice matched) to InP. Examples of these materials include semiconductors such as GaInAsP, GaInAs, InAlAs, and GaInAlAs. Substrate layer 102, together with the upper layers, shown schematically as two layers 104, 106 in FIG. 6, form a structure having a stepped pyramid cross section.

The stepped pyramid structure is operative to spatially separate the locations of different optical modes of light in different wavelengths that are guided in the structure. The stepped structures can operate as thermo-optical structures or as electro-optical structures. The construction and operation of optical amplitude adjusters, optical phase shifters, optical inputs and outputs, and waveguides such as S shaped waveguides having stepped pyramid structures as outlined in the present disclosure are detailed in the co-pending application Ser. No. 14/290,979, filed on May 29, 2014 and entitled: "MULTI-WAVELENGTH BAND OPTICAL PHASE AND AMPLITUDE CONTROLLER". According to an embodiment of the present disclosure, the optical elements of chip 82, including optical amplitude adjusters 92, optical phase shifters 94, optical inputs 96, and waveguides such as S shaped waveguides 98 can all have stepped pyramid structures as outlined above.

Preferably, the optical elements of chip 82 are formed out of a same set of layers and they are fabricated together. Fabrication of the stepped structures can involve repeated processing steps of etch-mask deposition and patterning, etching of the grown semiconductor material, and removal of the mask material. A combination of wet-chemical etching and dry etching (e.g., reactive ion etching and/or ion beam milling) processes can be used to form the stepped pyramid structures.

Additional steps for fabricating chip 82 can include deposition of dielectric materials such as silicon nitride or silicon dioxide. Common methods for dielectric deposition include chemical vapor deposition and vacuum deposition from sputtered targets of those materials. Yet other steps can include patterned deposition or deposition and patterned etching of metal strips. According to an embodiment of the present disclosure, thin metal strips applied to sides or tops of the stepped structure can be used as heaters 108 for thermo-optic devices. Alternatively, thicker metal strips can be used as electrodes 108 for electro-optic devices. In some cases, additional ion-implantation and/or annealing steps may be used to form low-resistance electrical contacts into the semiconductor material layers of the stepped structures. FIG. 6 illustrates low-resistance electrical contacts 110 formed into the top of layers 106 of the stepped structure of phase shifter 94.

The posts 90 may be fabricated in a plurality of sections, in alignment with the layers 101, 102, 104, 106, 130 forming the stepped structures. The various sections of the posts 90 may not have a same diameter or width but they are preferably concentrically aligned vertically. According to an embodiment of the present disclosure, the height of each section of posts 90 corresponds to the height of a layer of the stepped structures. For example, posts 90 can comprise a base section 112 having the same height as base layer 101, then a further section 114; having the same height as substrate layer 102. Post 90 can further comprise sections 115 and 116 having the same heights as subsequent layers 104 and 106, respectively. Optionally, section 115 of post 90 can comprise a first sub-section 117, having the height of electrical interconnections 118 between the post 90 and an electrode or heater 108 formed on a side of the stepped structure of phase shifter 94. Section 115 then comprise a second sub-section 120, where the sum of the heights of sections 117 and 120 is the same as layer 104. In some embodiments, base layer 101 may comprise a dielectric material.

According to an embodiment of the present disclosure, a section of posts 90 can alternatively be formed in a recess etched through two layers or more of the stepped structure, and have the height of said two layers or more.

Optionally, section 116 of post 90 can comprise a first sub-section 122, and a second sub-section 124 having the height of electrical interconnections 126 between the post 90 and low-resistance electrical contacts 110. The sum of the heights of sections 122 and 124 is the same as layer 106. On top of section 116, columns 90 can comprise a top section 128 having the height of the dielectric layer 130 above the top of electrical interconnection layer 126, on top of the stepped structure.

According to an embodiment of the present disclosure, the height of top section 128 of the columns 90 can be slightly increased such that the columns 90 protrude slightly above the top surface of dielectric 130 or the top surface of chip 82. This can for example be accomplished by etching the top surface of dielectric 130 after forming top section 128. This can also for example be accomplished by having a sacrificial layer on top of dielectric 130 when forming top section 128.

According to another embodiment of the present disclosure, the height of section 112 of the posts 90 can be slightly less than the height of base layer 101, such that the bottom of columns 90 is slightly recessed with respect to the bottom surface of chip 82.

Having the top of columns 90 protrude slightly above the top surface of chip 82 and the bottom of columns 90 being slightly recessed with respect to the bottom surface of chip 82 facilitates assembling chips 82 on top of each other.

The controlled height of posts 90 of chips 82 assembled on top of each other allows controlling accurately the vertical spacing between the optical elements in each chip 82, and in particular between the optical emitter apertures 86 in each chip 82.

The posts 90 in chips 82 assembled together overlay with and contact each other. Some of the posts 90 can also form vertical electrical interconnection paths that supply control signals to the components of the chips 82, such as the phase shifters 94 and amplitude adjusters 92.

The sections of post 90 can for example be formed by means such as sputtered deposition, evaporation and electroplating when posts 90 are made out of metal.

According to an embodiment of the present disclosure, the posts 90 can form part of heat-conductive walls and/or of metal enclosures that can be provided to thermally isolate adjacent optical amplitude adjusters 92 or adjacent optical phase shifters 94 of chip 82. The regions of chip 82 not occupied by the stepped structures and their electrodes/heaters or by the posts and interconnections are preferably filled with a dielectric material 130 such as a polymer or a spin-on glass. This dielectric material preferably has a low-refractive index, low thermal conductivity and low electrical conductivity. The material of base layer 101 likewise may comprise material such as a polymer or a spin-on glass and preferably has a low-refractive index, low thermal conductivity and low electrical conductivity.

Figure 7:
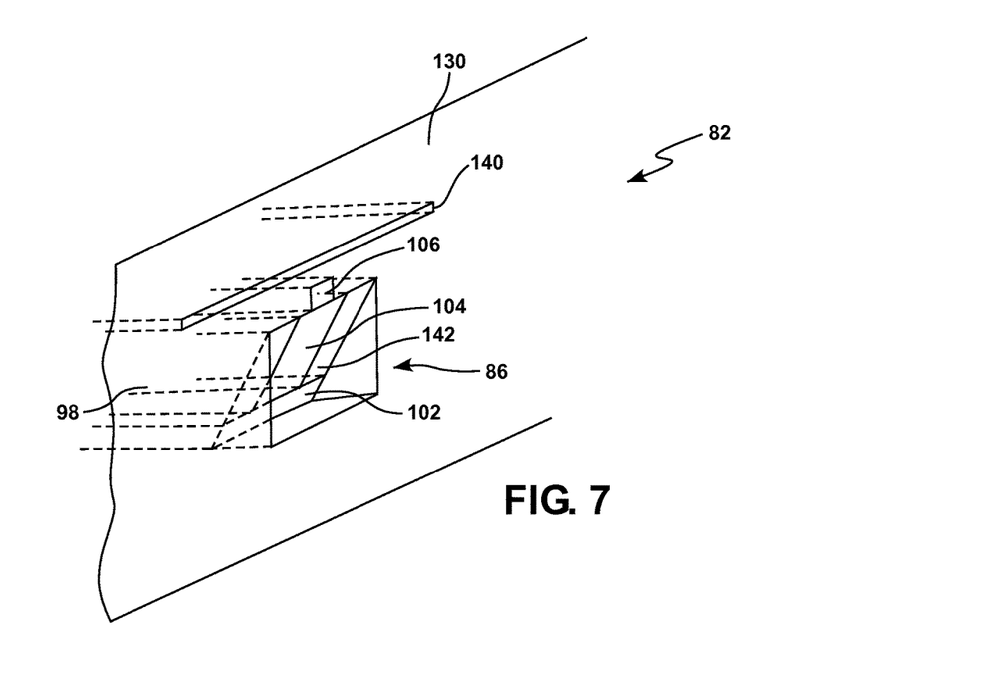
FIG. 7 illustrates an elevation view of an optical emitter of a two-dimensional optical phased array according to an embodiment of the present disclosure.

FIG. 7 illustrates an exemplary structure of an optical emitter aperture 86 of chip 82. A top conductive wall 140 was formed above the stepped structure coming out from S shaped waveguide 98, near the emitter side surface of Chip 82, on top of a layer of dielectric 130. Wall 140, for example made of metal, was then covered by a further layer of dielectric 130. The top of chip 82 was attached to a temporary transfer base (not shown); and an original growth substrate and the GaInAs stop etch layer 101 were removed.

Then, for example gray-scale lithography and a combination of dry etching and wet-chemical etching steps were used to etch in the side of chip 82 a substantially rectangular aperture having a tapered surface 142 developing inward chip 82 from the bottom edge of the top layer 106 of the stepped structure of the waveguide that meets the side of chip 82. Tapered surface 142 develops inward along the intermediary layers of the stepped structure, shown as layers 104, 102 in FIG. 7. After being etched, tapered surface 142 is covered with a conductive, for example metallic, material layer (such as Ti/Ag), for example using methods such as evaporation-deposition, sputtered deposition and electroplating. The conductive layer covering surface 142 forms a wall of a conductive-walled waveguide taper of aperture 86. According to an embodiment of the present disclosure, electrically conductive sidewalls (not shown) of the tapered waveguide are fabricated at the same time as posts 90. The conductive-walled tapered waveguide is formed at the output/emitter end/side of chip 82, away from the area of chip 82 that contains the phase shifters and optical amplitude adjusters. Thus, the region of chip 82 having the conductive-walled tapered waveguides does not need to also have conductive enclosures such as formed with the conductive walls 100 disclosed above.

After the conductive-walled tapered waveguides are completed, a further layer (not shown on FIG. 7) of dielectric material such as a polymer or a spin-on glass, can be deposited onto the top-surface of the flipped-down chip 82 that is on its transfer base. A bottom section of the posts 90 can then be formed through the further layer of dielectric material.

FIGS. 8A-8D outline major steps involved in the fabrication of the multi-chip optical phased array assembly according to an embodiment of the present disclosure.

Figure 8A:
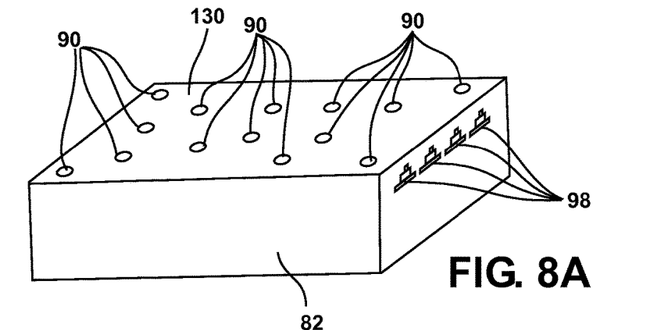
FIGS. 8A-8D illustrate manufacturing steps of a two-dimensional optical phased array according to an embodiment of the present disclosure.

FIG. 8A is an elevation view of a chip 82 after completion of its top dielectric layer 130, before etching of its optical emitter apertures 86. The ends of the stepped structure of the waveguide 98 that meet the emitter side of chip 82, as well as the ends of posts 90 that meet the top surface of chip 82, are shown.

Figure 8B:
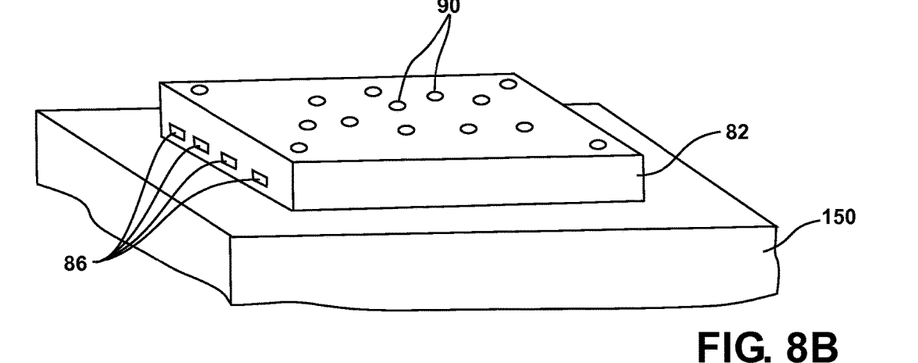

FIG. 8B is an elevation view of the same chip 82 after its top surface was attached to a transfer base 150, its bottom surface was etched to expose the bottom layers of the stepped structure of the optical elements, the optical emitter apertures 86 were etched and the further layer of dielectric material deposited onto the top-surface of the flipped-down chip 82. The ends of posts 90 that meet the top surface of the flipped-down chip 82 are shown.

Figure 8C:
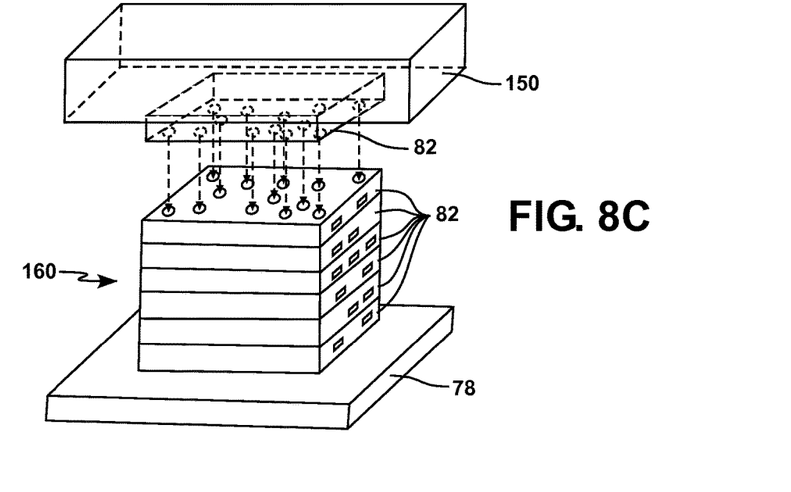

FIG. 8C is an elevation view of the chip 82 attached to a transfer base 150 of FIG. 8B being positioned for attachment onto a stack 160 of chips 82. According to an embodiment of the present disclosure, the bottom chip of stack 160 can be attached to an alignment base 78 that contains alignment-reference marks. According to an embodiment of the present disclosure, alignment base 78 can comprise an electronic circuit that can be coupled to at least one post 90 of stack 160. According to an embodiment of the present disclosure, alignment base 78 can comprise at least a contact pad that can be coupled to at least one post 90 of stack 160, the contact pad being coupled to a wire and/or external connection pin.

According to an embodiment of the present disclosure, the phased array comprises a two-dimensional array of non-uniformly spaced emitters 86 having a two-axis pseudo-random (PR) emitter spacing. Accordingly, the multiple chips 82 of stack 160 have different PR emitter spacing. As illustrated hereafter in relation with FIG. 10, the multiple chips 82 can be formed concurrently on a same wafer or growth substrate before being separated from the wafer and stacked together.

The two-dimensional array can be fabricated by doing an aligned bonding of a first chip 82 onto alignment base 78. According to an embodiment of the present e-mail, the first chip 82 can be bonded permanently to alignment base 78 using epoxy or other known chip to chip permanent assembly techniques such as for example described in the prior art referenced cited above.

The transfer base 150 of the first chip 82 is then removed, and a second chip 82 is aligned with the first chip 82 and bonded to it, using the same alignment marks on the alignment base to ensure there is no walk-off in the relative locations of the chips.

Bonding the chips 82 comprises contacting and attaching the posts 90 of the two chips together. According to an embodiment of the present disclosure, the alignment base 78 and/or the transfer base 150 can comprise a fan-out interconnect circuit connecting the posts 90 to probe pads for the testing of the electrical continuity of the posts 90 of the chips assembled together. According to an embodiment of the present disclosure, the posts 90 of two chips can be assembled together using known metal to metal bonding techniques, such as for example described in the prior art referenced cited above.

According to an embodiment of the present invention, the connection of posts 90 to each other forms a rigid mechanical frame for the multi-chip structure, for which the spacing between the phased-array elements should remain relatively unchanged despite vibrations and despite ambient temperature and pressure changes.

The chip assembly process is repeated, bonding another chip 82 and then removing its transfer base 150, to form the stack 160 of a plurality of chips 82. According to an embodiment of the present invention, in order to improve the yield of the overall assembly process, small numbers of chips 82 can be bonded together for form sub-stacks. After a sub-stack is formed, the sub-stack can be tested to verify the alignment accuracy of its chips and the electrical continuity to the posts 90 used as electrodes of the phase shifters and power splitters. Since posts 90 extend completely through a chip, when corresponding stacks of posts 90 extend completely through a sub-stack of chips, said sub-stack can be tested for electrical continuity.

Qualified sub-stacks can then be assembled together by aligned bonding to a stack-alignment base (or to another sub-stack on that alignment base) and removal of their previous alignment base. The assembled stack forms a two-dimensional optical phased array according to the present disclosure. The front and back end-faces (or input and emitter sides) of the stack 160 of chips 82 can be polished. Microlens arrays (not shown) can then be aligned with the optical inputs/optical emitters and attached to the stack.

It is noted that, to enable a first chip 82 to be detached later from its chip-alignment base 150 (and thereby to detach the stack containing that first chip from the base 150), a method for a temporary physical and electrical attachment must be used. Such temporary-attachment method is different from the method used for making more permanent bonds of one chip onto another chip, or for bonding one block onto another block. According to an embodiment of the present disclosure, the first chip can be attached temporarily to its base together using known temporary attachment techniques, such as for example described in the prior art references cited above.

Figure 8D:
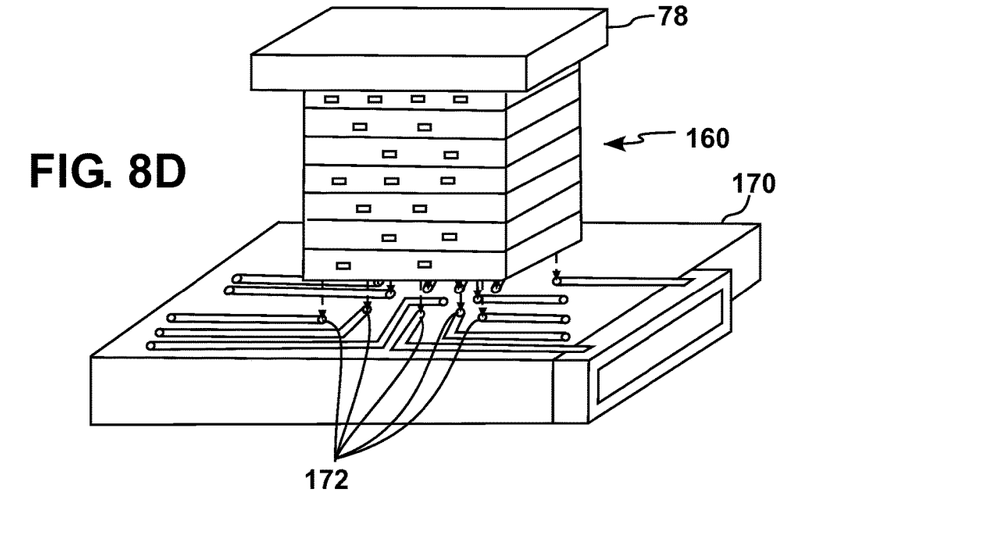

FIG. 8D shows stack 160 being aligned with a CMOS controller chip 170 prior to being assembled to said controller chip 170. Controller chip 170 comprises contact pads 172 provided for being bonded to the posts 90 of stack 160, for example using solder bumps (not shown) arranged at the end of the posts 90 or on contact pads 172.

In some embodiments, the first chip 82 of the stack can be bonded permanently onto the chip-alignment base 78. Preferably, in such embodiment the chip-alignment base 78 can be made from a material having high thermal conductivity, such as silicon or diamond, to serve as a heat spreader to facilitate the removal of heat from a stack made of chips 82 that comprise for example thermo-optic phase shifters and/or optical amplitude adjusters such as two-mode couplers. According to an alternative embodiment of the present disclosure, the alignment base 78 of the stack 160 can also be separated from the stack after the stack is attached to the controller 170.

Figure 9:
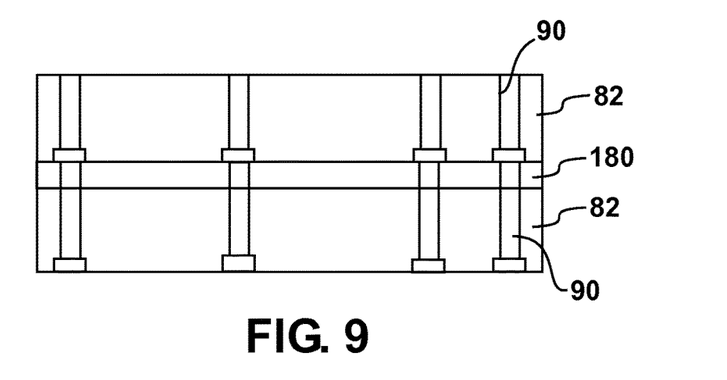
FIG. 9 illustrates a cross section of an assembly of two chips according to an embodiment of the present disclosure

FIG. 9 illustrates a cross section of an assembly of two chips 82 of different heights. According to an embodiment of the present disclosure, in order to facilitate having emitter apertures 86 arranged at non-uniform pseudo-random distances from each other, the height of the posts 90 of consecutive chips 82 can be made different. According to an embodiment of the present invention, the chips 82 can be assembled to form a phased array such as disclosed in the co-pending U.S. patent Ser. No. 14/290,983, filed on May 29, 2014 and entitled: "A PSEUDO-RANDOMLY SPACED TWO-DIMENSIONAL PHASED ARRAY ASSEMBLY".

Even if the chips 82 are fabricated on a single substrate, a variation in the desired heights of the posts 90 fabricated on the substrate can be accommodated by additional electroplating or metal deposition or etching steps that adjust the post heights as needed for some regions of the substrate wafer where the higher chips 82 are fabricated and not for other regions where the other chips 82 are fabricated. An additional layer of dielectric 180 can then be added on the surface of a chip 82 between the posts 90 the height of which has been increased.

Figure 10:
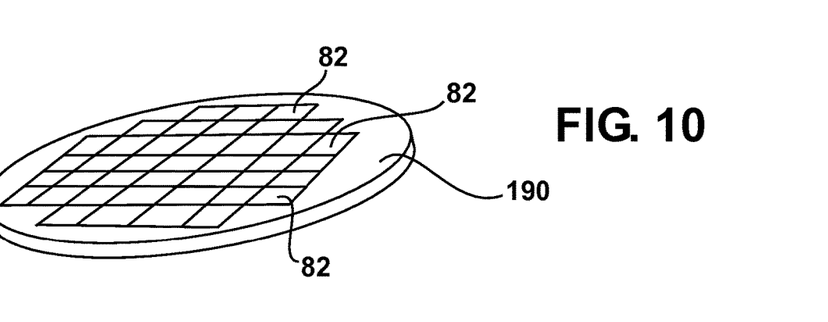
FIG. 10 illustrates a manufacturing step of a two-dimensional optical phased array according to an embodiment of the present disclosure.

FIG. 10 illustrates a manufacturing step of a two-dimensional optical phased array according to an embodiment of the present disclosure, where a plurality of chips 82 are fabricated on a single substrate 190. Almost all of the steps involved in fabricating the mono-dimensional array of chips 82 are done on the top-side of the wafer 190, which contains the grown epitaxial layers. First, multiple layers of epitaxial material are grown for fabricating the optical elements of chip 82, such as phase shifters, optical power splitters and input and output waveguide segments using known epi-growth, lithographic patterning, etching, dielectric deposition and metal deposition processes. The metal posts 90 are fabricated at the same time, as well as metal interconnect lines and the side and top walls of the output tapers of the optical emitters, as well as the optional vertical conductive walls that surround each phase shifter and two-mode coupler. The chips are then planarized, before optional horizontal (parallel to the chip) top conductive walls of the conductive enclosures are fabricated. Afterwards, the wafer is mounted onto a transfer base and the growth substrate removed. The sloped portion of the output taper is then formed, before a metal cover of the taper and, if necessary, a bottom plate of the conductive enclosures, are formed. At this stage, the chip can also be planarized to prepare for a subsequent fabrication of the multi-chip stack.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

For example as detailed above, posts 90 provide mechanical control of the vertical spacing between adjacent chips 82 of the stack 160. Posts 90 can also provide electrical interconnection paths between electrodes of the optical elements in the chips 82 and the electronic integrated circuit that supplies the control signals for those electrodes. However, according to alternative embodiments of the present disclosure, posts 90 can also operate as thermally conductive paths for removing heat generated by the phased array elements in a chip 82 and conducting that heat to heat-sinks that may be located above or beneath the stack, According to alternative embodiments of the present disclosure, posts 90 can also operate as thermal shielding to establish regions having a reference temperature for thermo-optic controlled elements according to alternative embodiments of the present disclosure, posts 90 can also operate as thermal isolation between adjacent optical elements of chips 82.

Further, according to an embodiment of the present invention, all the stacks of all the posts 90 of all the Chips 82 do not necessarily extend from the top to the bottom of stack 160. For example, some stacks of posts 90 transmitting signals from the controller chip 170 to some chips 82 in the stack need not extend beyond said chips 82.

The posts 90 have been shown having substantially cylindrical cross sections; however, posts 90 having different cross sections, such as rectangular cross sections, can also be used.

A phased array according to the present disclosure was described having an input side for receiving light from a light source and an emitter side for directionally emitting one or more beams of light. However, it is to be noted that the emitter side of a phased array according to the present disclosure can also be used as a sensor input side for directionally receiving light whereby the side described as an input side becomes a sensor output side.

It should be understood that the two-dimensional phased array beam former disclosed herein can be adapted for operation at different ranges of electromagnetic wavelength and frequency. These wavelengths range from below 0.5 μm to 10 μm and even to 100 μm and larger. The description above would then have to be adapted to relate to structures capable of having the same effect on waves having wavelengths of 0.5 μm to 10 μm or even to 100 μm and larger rather than on lights as described in the exemplary embodiments detailed above.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A two-dimensional phased array beam former comprising at least first and second chips having each top and bottom surfaces, the bottom surface of the first chip being attached to the top surface of the second chip;
the first and second chips having each an emitter side surface, the emitter side surfaces of the first and second chips facing a same direction and comprising each a plurality of emitters;
wherein each of said first and second chips comprises at least one conductive post extending between said top and bottom surfaces;
the at least one conductive post of the first chip being vertically aligned with and connected to the at least one conductive post of the second chip; and wherein at least one of the first and second chips comprises at least one heat conducting wall that is not in electrical contact with the at least one conductive post.

2. The two-dimensional phased array beam former of claim 1, wherein the plurality of emitters of each chip is a plurality of optical emitters, and wherein the two-dimensional phased array beam former is a two-dimensional optical phased array.

3. The two-dimensional optical phased array of claim 2, wherein the first and second chips comprise each a plurality of optical phase shifters, each optical phase shifter being coupled to an optical emitter.

4. The two-dimensional optical phased array of claim 3, wherein the first and second chips comprise each a plurality of optical amplitude adjusters, each optical amplitude adjuster being coupled to an optical phase shifter.

5. The two-dimensional optical phased array of claim 4, wherein said at least one heat conducting wall is arranged between at least two optical amplitude adjusters of said plurality of optical amplitude adjusters.

6. The two-dimensional optical phased array of claim 3, comprising a third chip attached to one of the top surface of the first chip and the bottom surface of the second chip; the third chip comprising an integrated electronic circuit that is electrically connected to the at least one conductive post of said one of the first chip and the second chip to which the third chip is attached to.

7. The two-dimensional optical phased array of claim 6, wherein said integrated electronic circuit is arranged to provide at least a control signal for controlling the phase and/or amplitude of the light emitted from at least one optical emitter.

8. The two-dimensional optical phased array of claim 7, wherein said one of the first chip and the second chip attached to the third chip comprises a heater.

9. The two-dimensional optical phased array of claim 8, wherein said one of the first chip and the second chip attached to the third chip comprises a second conductive post extending between its top and bottom surfaces, said second conductive post being connected electrically to said heater and to said integrated electronic circuit.

10. The two-dimensional optical phased array of claim 1, wherein the conductive posts of the first and second chips have different heights.

11. The two-dimensional optical phased array of claim 1, wherein the bottom surface of the first chip is attached to the top surface of the second chip by at least an attachment of the conductive post of the first chip to the conductive post of the second chip.

12. The two-dimensional optical phased array of claim 1, wherein the first and second chips comprise each a plurality of conducting posts extending between the top and bottom surfaces of the chips; the plurality of conducting posts of the first chip having positions vertically aligned with the plurality of conducting posts of the second chip; wherein the plurality of conducting posts of the first and second chips are attached and form a plurality of conducting columns;
  wherein at least one conducting column forms an electrical interconnection path arranged to supply control signals to at least one component in at least one chip of the two-dimensional optical phased array; and
  at least one conducting column is arranged so that it forms no electrical interconnection path to any component in any chip of the two-dimensional optical phased array.

13. A method of fabricating a two-dimensional phased array beam former, the method comprising:
  fabricating at least first and second chips having each top and bottom surfaces, wherein:
  each of said first and second chips comprises at least one conductive post extending between said top and bottom surfaces at a same position in said first and second chips; at least one of the first and second chips comprising at least one heat conducting wall that is not in electrical contact with the at least one conductive post; and wherein
  the first and second chips each have an emitter side surface comprising a plurality of emitters;
  the method further comprising:
  attaching the bottom surface of the first chip to the top surface of the second chip; such that the emitter side surfaces of the first and second chips face a same direction;
  said attaching the bottom surface of the first chip to the top surface of the second chip comprising attaching the conductive post of the first chip to the conductive post of the second chip.

14. The method of claim 13, wherein the plurality of emitters of each chip is a plurality of optical emitters, and wherein the two-dimensional phased array beam former is a two-dimensional optical phased array.

15. The method of claim 14, wherein said fabricating at least first and second chips comprises fabricating first and second chips having each a plurality of optical phase shifters, each optical phase shifter being coupled to an optical emitter.

16. The method of claim 15, wherein said fabricating at least first and second chips comprises fabricating first and second chips having each a plurality of optical amplitude adjusters, each optical amplitude adjuster being coupled to an optical phase shifter.

17. The method of claim 16, wherein:
  said fabricating at least first and second chips comprises fabricating said at least one heat conductive wall between at least two optical amplitude adjusters of at least one of the first and second chips.

18. The method of claim 13, wherein said fabricating at least first and second chips comprises:
  fabricating said first and second chips on a common substrate; and
  separating said first and second chips.

19. The method of claim 18, wherein said separating said first and second chips comprises separating the first chip on a first portion of said common substrate from the second chip on a second portion of said common substrate.

20. The method of claim 13, wherein:
  the at least first and second chips comprise each a plurality of conducting posts extending between the top and bottom surfaces of the chips; the plurality of conducting posts of the first chip having positions vertically aligned with the plurality of conducting posts of the second chip;
  said attaching the bottom surface of the first chip to the top surface of the second chip thus comprising forming a plurality of conducting columns by connecting the plurality of aligned posts of the chips;
  wherein at least one conducting column forms an electrical interconnection path arranged to supply control signals to at least one component in at least one chip of the two-dimensional phased array beam former; and
  at least one conducting column is arranged so that it forms no electrical interconnection path to any component in any chip of the two-dimensional optical phased array beam former.

21. The method of claim 13, wherein:
said fabricating at least first and second chips comprises fabricating conductive posts having different heights.

\* \* \* \* \*